(12) United States Patent
Chen et al.

(10) Patent No.: US 11,290,091 B2
(45) Date of Patent: Mar. 29, 2022

(54) HIGH-SPEED REGENERATIVE COMPARATOR CIRCUIT

(71) Applicant: NO.24 RESEARCH INSTITUTE OF CHINA ELECTRONICS TECHNOLOGY GROUP CORPORATION, Chongqing (CN)

(72) Inventors: Xi Chen, Chongqing (CN); Xiaofeng Shen, Chongqing (CN); Xingfa Huang, Chongqing (CN); Liang Li, Chongqing (CN); Mingyuan Xu, Chongqing (CN); Jian'an Wang, Chongqing (CN); Dongbing Fu, Chongqing (CN); Guangbing Chen, Chongqing (CN)

(73) Assignee: NO.24 RESEARCH INSTITUTE OF CHINA ELECTRONICS TECHNOLOGY GROUP CORPORATION, Chongqing (CN)

( * ) Notice: Subject to any disclaimer, the term of this patent is extended or adjusted under 35 U.S.C. 154(b) by 0 days.

(21) Appl. No.: 17/276,829

(22) PCT Filed: Aug. 1, 2019

(86) PCT No.: PCT/CN2019/098795
§ 371 (c)(1),
(2) Date: Mar. 17, 2021

(87) PCT Pub. No.: WO2020/057269
PCT Pub. Date: Mar. 26, 2020

(65) Prior Publication Data
US 2022/0052673 A1  Feb. 17, 2022

(30) Foreign Application Priority Data

Sep. 17, 2018  (CN) .......................... 201811078617.X

(51) Int. Cl.
*H03K 3/356* (2006.01)
*H03K 5/22* (2006.01)
(Continued)

(52) U.S. Cl.
CPC ......... *H03K 3/356034* (2013.01); *H03K 5/22* (2013.01); *H03K 17/687* (2013.01); *H03K 2005/00013* (2013.01)

(58) Field of Classification Search
CPC .. H03K 3/356034; H03K 5/22; H03K 17/687; H03K 2005/00013
(Continued)

(56) References Cited

U.S. PATENT DOCUMENTS 6,292,030 B1 * 9/2001 Shih ................. H03K 3/356113
327/55
6,340,942 B1 * 1/2002 Zhou ....................... H03M 1/42
341/158

* cited by examiner

*Primary Examiner* — Tomi Skibinski

(57) ABSTRACT

The present disclosure provides a high-speed regenerative comparator circuit, including: a signal input stage connected with an input terminal for differential signal input; a latch for caching and serving as a differential signal output terminal; a current source connected with the signal input stage for providing a power supply voltage; a fast path connected with the output terminal and used for increasing a voltage difference of the output terminal and turning on a positive feedback network of the latch; and a reset switch, including a first reset switch and a second reset switch. In the high-speed regenerative comparator circuit of the present disclosure, the transmission delay of the regenerative comparator circuit can be greatly reduced; and in a latch phase, a bias voltage is disconnected by means of timing control, and thus the power consumption of a comparator can be reduced. The present disclosure has simple circuit and high reliability.

8 Claims, 1 Drawing Sheet

(51) Int. Cl.
*H03K 17/687* (2006.01)
*H03K 5/00* (2006.01)
(58) Field of Classification Search
USPC .......................................................... 327/65
See application file for complete search history.

US 11,290,091 B2

HIGH-SPEED REGENERATIVE COMPARATOR CIRCUIT

CROSS REFERENCES TO RELATED APPLICATIONS

This is a Sect. 371 National Stage application of a PCT International Application No. PCT/CN2019/098795, filed on Aug. 1, 2018, which claims priority of a Chinese Patent Applications No. 201811078617X, filed on Sep. 17, 2018, the content of which is hereby incorporated by reference in its entirety for all purposes.

TECHNICAL FIELD

The present disclosure relates to the field of electronics, and in particular, to a high-speed regenerative comparator circuit.

BACKGROUND

Comparator is an important part of modern integrated circuits, and it is widely used in analog-to-digital or digital-to-analog converters. With the rapid development of converters, the performance requirements of comparators are getting higher and higher, and the research direction is mainly focused on transmission delay, offset voltage and power consumption. Among them, the transmission delay is the most important parameter in the indicators of the comparator circuit. In high-speed converters, the transmission delay of the comparator often directly limits the maximum operating speed of the converter.

For a traditional regenerative comparator, the transmission delay is mainly composed of the pre-latching delay before activating the latch and the latching delay of the latch. The expression of total transmission delay is:

$$t_{delay} = t_{delay\ 1} + t_{delay\ 2}$$

At present, some improved regenerative comparators reduce the delay time tdelay2 by increasing the current source when the latch is working and reducing the time constant of the latch. The overall speed of the comparator is improved at the expense of power consumption. The smaller the input signal is, the longer the delay time tdelay1 is, which is a problem with the traditional regenerative comparators.

SUMMARY

The present disclosure provides a high-speed regenerative comparator circuit, to solve the above-mentioned problems.

The high-speed regenerative comparator circuit according to the present disclosure includes:

a signal input stage connected with an input terminal for differential signal input;

a latch for caching and serving as a differential signal output terminal;

a current source connected with the signal input stage for providing a power supply voltage;

a fast path connected with the output terminal for increasing a voltage difference of the output terminal and turning on a positive feedback network of the latch; and a reset switch, including a first reset switch and a second reset switch.

The second reset switch is connected with a first clock signal, and the first clock signal controls a working state of the comparator circuit.

The first reset switch is connected with a second clock signal, and the second clock signal controls the bias voltage of the current source.

The fast path is connected with a third clock signal, and the third clock signal controls the working state of the fast path.

Further, the signal input stage includes a first PMOS transistor and a second PMOS transistor, and the current source includes a fifth PMOS transistor.

The gate of the first PMOS transistor and the gate of the second PMOS transistor are respectively connected with the differential input terminals. The source of the first PMOS transistor and the source of the second PMOS transistor are connected with the drain of the fifth PMOS transistor. The drain of the first PMOS transistor and the drain of the second PMOS transistor are respectively connected with the latch. The source of the fifth PMOS transistor is connected with the power supply voltage, and the gate of the fifth PMOS transistor is connected with the first reset switch.

Further, the latch includes a third NMOS transistor and a fourth NMOS transistor.

The source of the third NMOS transistor and the source of the fourth NMOS transistor are respectively grounded. The drain of the third NMOS transistor is connected with the drain of the first PMOS transistor, and the drain of the fourth NMOS transistor is connected with the drain of the second PMOS transistor. The gate of the third NMOS transistor is connected with the drain of the fourth NMOS transistor, and serves as the first output terminal of the differential signal. The gate of the fourth NMOS transistor is connected with the drain of the third NMOS transistor and serves as the second output terminal of the differential signal.

Further, the fast path includes an eighth PMOS transistor and a ninth PMOS transistor.

The source of the eighth PMOS transistor and the source of the ninth PMOS transistor are respectively connected with the power supply voltage. The gate of the eighth PMOS transistor and the gate of the ninth PMOS transistor are respectively connected with the third clock signal. The drain of the eighth PMOS transistor is connected with the first output terminal of the differential signal, and the drain of the ninth PMOS transistor is connected with the second output terminal of the differential signal.

Further, the first reset switch includes a sixth PMOS transistor. The source of the sixth PMOS transistor is connected with the gate of the fifth PMOS transistor. The gate of the sixth PMOS transistor is connected with a second clock signal, and the drain of the sixth PMOS transistor is connected with the bias voltage.

Further, the second reset switch includes a seventh NMOS transistor. The source of the seventh NMOS transistor is connected with the first output terminal of the differential signal, and the drain of the seventh NMOS transistor is connected with the second output terminal of the differential signal. The gate of the seventh NMOS transistor is connected with the first clock signal.

Correspondingly, the present disclosure further provides a method for controlling a clock signal of a high-speed regenerative comparator circuit. When the first clock signal is at a high level, the comparator is in a reset state; at this time, the second clock signal is at a high level, the first reset switch turns off the bias voltage, the third clock signal is at a high level, and the path from the output terminal of the differential signal to the power supply voltage in the fast path is disconnected.

Further, when the first clock signal is at a low level, the comparator is in a latch state. At this time, the second reset switch is turned off, the current source is connected with the bias voltage, the signal input stage amplifies the input signal, the voltage of the output terminal rises until the second clock signal hops from low level to high level, and the first reset switch turns off the bias voltage; at this time, the third clock signal hops from high level to low level, the path from the output terminal of the differential signal to the power supply voltage in the fast path is disconnected, the terminal of the output terminals of differential signal that first reaches the threshold voltage turns on the positive feedback network of the latch, and pulls the output voltage to the power supply voltage.

Beneficial effects of the present disclosure: according to the high-speed regenerative comparator circuit of the present disclosure, the transmission delay of the regenerative comparator circuit can be greatly reduced; and in a latch phase, a bias voltage is disconnected by means of timing control, and thus the power consumption of a comparator can be reduced. The present disclosure has the advantages of simple circuit implementation and high reliability.

DETAILED DESCRIPTION OF THE PREFERRED EMBODIMENTS

The embodiments of the present disclosure will be described below. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure. It needs to be stated that the following embodiments and the features in the embodiments can be combined with one another under the situation of no conflict.

It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complicated.

In the following description, plentiful details are discussed to provide a more thorough explanation of the embodiments of the present disclosure. However, it is obvious to those skilled in the art that the embodiments of the present disclosure can be implemented without these specific details. In other embodiments, the structures and equipments are shown in the form of block diagrams rather than in the form of details, so as to avoid making the embodiments of the present disclosure difficult to understand.

In this embodiment, the high-speed regenerative comparator circuit includes:

a signal input stage connected with an input terminal for differential signal input;

a latch for caching and serving as a differential signal output terminal;

a current source connected with the signal input stage for providing a power supply voltage;

a fast path connected with the output terminal for increasing a voltage difference of the output terminal and turning on a positive feedback network of the latch; and a reset switch, including a first reset switch and a second reset switch.

The second reset switch is connected with a first clock signal, and the working state of the comparator is controlled by the first clock signal.

The first reset switch is connected with a second clock signal, and the bias voltage of the current source is controlled by the second clock signal.

The fast path is connected with a third clock signal, and the working state of the fast path is controlled by the third clock signal.

Figure 1:
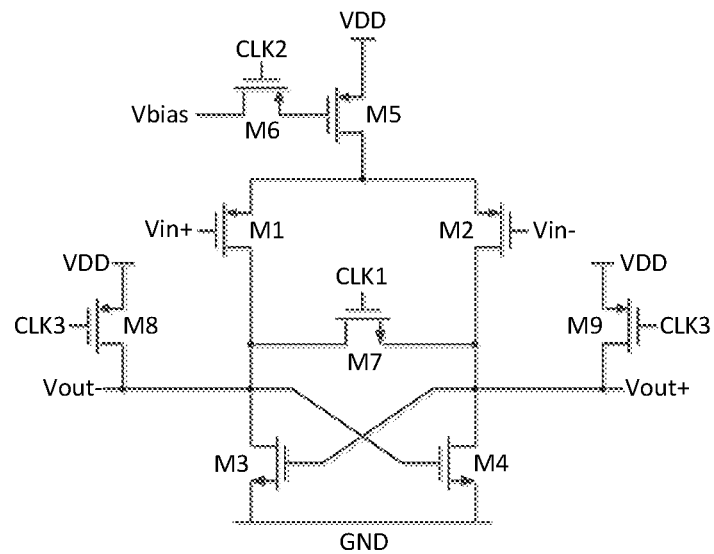
FIG. 1 is a circuit diagram of a regenerative comparator circuit according to an Embodiment of the present disclosure.

As shown in FIG. 1, the signal input stage in this embodiment includes a first PMOS transistor M1 and a second PMOS transistor M2, and the current source includes a fifth PMOS transistor M5.

The gate of the first PMOS transistor M1 and the gate of the second PMOS transistor M2 are respectively connected with the differential input terminals. The source of the first PMOS transistor M1 and the source of the second PMOS transistor M2 are connected with the drain of the fifth PMOS transistor M5. The drain of the first PMOS transistor M1 and the drain of the second PMOS transistor M2 are respectively connected with the latch. The source of the fifth PMOS transistor M5 is connected with the power supply voltage, and the gate of the fifth PMOS transistor M5 is connected with the first reset switch.

The latch in this embodiment includes a third NMOS transistor M3 and a fourth NMOS transistor M4.

The source of the third NMOS transistor M3 and the source of the fourth NMOS transistor M4 are respectively grounded. The drain of the third NMOS transistor M3 is connected with the drain of the first PMOS transistor M1, and the drain of the fourth NMOS transistor M4 is connected with the drain of the second PMOS transistor M2. The gate of the third NMOS transistor M3 is connected with the drain of the fourth NMOS transistor M4, and serves as the first output terminal of the differential signal. The gate of the fourth NMOS transistor M4 is connected with the drain of the third NMOS transistor M3 and serves as the second output terminal of the differential signal.

The fast path in this embodiment includes an eighth PMOS transistor M8 and a ninth PMOS transistor M9.

The source of the eighth PMOS transistor M8 and the source of the ninth PMOS transistor M9 are respectively connected with the power supply voltage. The gate of the eighth PMOS transistor M8 and the gate of the ninth PMOS transistor M9 are respectively connected with the third clock signal CLK3. The drain of the eighth PMOS transistor M8 is connected with the first output terminal of the differential signal, and the drain of the ninth PMOS transistor M9 is connected with the second output terminal of the differential signal.

The first reset switch in this embodiment includes a sixth PMOS transistor M6. The source of the sixth PMOS transistor M6 is connected with the gate of the fifth PMOS transistor M5. The gate of the sixth PMOS transistor M6 is connected with the second clock signal CLK2, and the drain of the sixth PMOS transistor M6 is connected with the bias voltage. The second reset switch includes a seventh NMOS transistor M7. The source of the seventh NMOS transistor M7 is connected with the first output terminal of the differential signal, and the drain of the seventh NMOS transistor M7 is connected with the second output terminal of the differential signal. The gate of the seventh NMOS transistor M7 is connected with the first clock signal CLK1.

Figure 2:
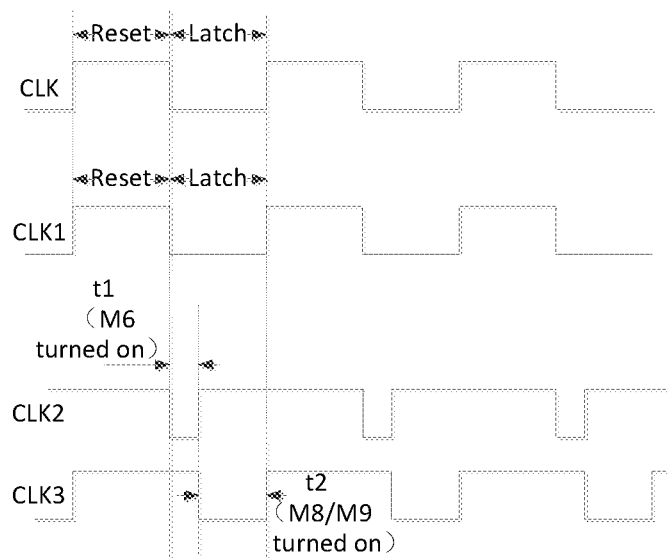
FIG. 2 is a timing diagram of the clock signals CLK1, CLK2 and CLK3 of the regenerative comparator circuit according to an embodiment of the present disclosure.

In this embodiment, the working state of the comparator includes a reset state and a latch state. As shown in FIG. 2, when the first clock signal CLK1 is at a high level, the entire comparator is in a reset state. At this time, the seventh NMOS transistor M7 resets the latches M3 and M4, and pulls the output signals Vout+ and Vout− from VDD (logic "1") or GND (logic "0") to voltage Vx (logic "0"). At this time, the second clock signal CLK2 is at a high level, and the sixth PMOS transistor M6 turns off the bias voltage of the fifth PMOS transistor M5 in the current source. At this time, the third clock signal CLK3 is at a high level, and the fast paths from the output nodes Vout+/Vout− to VDD (logic "1"), i.e., the eighth PMOS transistor M8 and the ninth PMOS transistor M9, are turned off.

When the first clock signal CLK1 is at a low level, the entire comparator is in a latch state. At this time, the seventh NMOS transistor M7 in the reset switch is turned off, the fifth PMOS transistor M5 in the current source is connected with the bias voltage; the input pair transistors, i.e., the first PMOS transistor M1 and the second PMOS transistor M2, amplify the differential input signals Vin+ and Vin−, the voltages of the output terminals start to rise from Vx, the rising speeds of Vout+ and Vout− are slightly different and slower. After a time t1, the second clock signal CLK2 becomes at a high level, the sixth PMOS transistor M6 turns off the bias voltage of the fifth PMOS transistor M5 in the current source again, and the input pair transistors, i.e., the first PMOS transistor M1 and the second PMOS transistor M2 no longer amplify the differential input signals. At this time, there is a voltage difference between the output nodes Vout+/Vout−. At this time, the third clock signal CLK3 becomes at a low level, the fast paths from the output nodes Vout+/Vout− to VDD (logic "1"), i.e., the eighth PMOS transistor M8 and the ninth PMOS transistor M9, are turned on, and the voltages of the output nodes Vout+/Vout− are rapidly charged to the threshold voltages of the third NMOS transistor M3 and the fourth NMOS transistor M4. Since there is a voltage difference between Vout+/Vout− when a small signal is established, even if the input differential signal is small, the voltage difference between Vout+/Vout− after being amplified for a short time t1 is still very small. When the fast path is turned on, the voltage difference is rapidly increased, the terminal which reaches the threshold voltage first would turn on the positive feedback network of the latch, so that voltages at the output terminals Vout+/Vout− are pulled to VDD (logic "1") or GND (logic "0").

Note that in the corresponding drawings of the embodiment, lines are used to represent signals. Some lines are thick to indicate more constituent signal paths, and/or some lines have arrows at one or more ends to indicate the main flow of information. These signs are not intended to limit the present disclosure. In fact, using these lines in combination with one or more exemplary embodiments helps to connect circuits or logic units more easily. Any signal represented (determined by design requirements or preferences) can actually include one or more signals that can be transmitted in any direction and can be implemented in any appropriate type of signal scheme.

Unless otherwise specified, the use of ordinal adjectives such as "first", "second" to describe a common object are merely referring to different instances of the same object, instead of implying that the objects so described must be in a given order, whether temporally, spatially, sequentially, or in any other way.

References in the specification to "embodiments," "an embodiment," "some embodiments," or "other embodiments" mean that specific features, structures, or characteristics described in combination with the embodiments are included in at least some embodiments, but not necessarily all the embodiments. Multiple appearances of "embodiments", "an embodiment", and "some embodiments" do not necessarily all refer to the same embodiment. If the specification describes that a part, feature, structure or characteristic "can", "may" or "could" be included, then the specific part, feature, structure or characteristic is not required to be included. If the specification or claim mentions "an" element, it does not mean that there is only one element. If the specification or claim refers to "an additional" element, it does not exclude the presence of more than one additional element.

The above-mentioned embodiments are just used for exemplarily describing the principle and effects of the present disclosure instead of limiting the present disclosure. Modifications or variations of the above-described embodiments may be made by those skilled in the art without departing from the spirit and scope of the disclosure. Therefore, all equivalent modifications or changes made by those who have common knowledge in the art without departing from the spirit and technical concept disclosed by the present disclosure shall be still covered by the claims of the present disclosure.

The invention claimed is:

1. A high-speed regenerative comparator circuit, comprising:
 a signal input stage connected with an input terminal for differential signal input;
 a latch for caching and serving as a differential signal output terminal;
 a current source connected with the signal input stage for providing a power supply voltage;
 a fast path connected with the output terminal for increasing a voltage difference of the output terminal and turning on a positive feedback network of the latch; and
 a reset switch, including a first reset switch and a second reset switch, wherein
  the second reset switch is connected with a first clock signal, and the first clock signal controls a working state of the comparator circuit;
  the first reset switch is connected with a second clock signal, and the second clock signal controls a bias voltage of the current source;
  the fast path is connected with a third clock signal, and the third clock signal controls a working state of the fast path.

2. A The high-speed regenerative comparator circuit according to claim 1, wherein the signal input stage includes a first PMOS transistor and a second PMOS transistor, and the current source includes a fifth PMOS transistor;
 a gate of the first PMOS transistor and a gate of the second PMOS transistor are respectively connected with differential input terminals, a source of the first PMOS transistor and a source of the second PMOS transistor are connected with a drain of the fifth PMOS transistor, a drain of the first PMOS transistor and a drain of the second PMOS transistor are respectively connected with the latch, a source of the fifth PMOS transistor is connected with the power supply voltage, and a gate of the fifth PMOS transistor is connected with the first reset switch.

3. A The high-speed regenerative comparator circuit according to claim 2, wherein the latch includes a third NMOS transistor and a fourth NMOS transistor, wherein,
a source of the third NMOS transistor and a source of the fourth NMOS transistor are respectively grounded, a drain of the third NMOS transistor is connected with a drain of the first PMOS transistor, a drain of the fourth NMOS transistor is connected with a drain of the second PMOS transistor, a gate of the third NMOS transistor is connected with a drain of the fourth NMOS transistor and serves as a first output terminal of the differential signal, and a gate of the fourth NMOS transistor is connected with a drain of the third NMOS transistor and serves as a second output terminal of the differential signal.

4. A The high-speed regenerative comparator circuit according to claim 3, wherein the fast path includes an eighth PMOS transistor and a ninth PMOS transistor, wherein,
a source of the eighth PMOS transistor and a source of the ninth PMOS transistor are respectively connected with the power supply voltage, a gate of the eighth PMOS transistor and a gate of the ninth PMOS transistor are respectively connected with the third clock signal, a drain of the eighth PMOS transistor is connected with the first output terminal of the differential signal, and a drain of the ninth PMOS transistor is connected with the second output terminal of the differential signal.

5. A The high-speed regenerative comparator circuit according to claim 2, wherein the first reset switch includes a sixth PMOS transistor, a source of the sixth PMOS transistor is connected with a gate of the fifth PMOS transistor, a gate of the sixth PMOS transistor is connected with the second clock signal, and a drain of the sixth PMOS transistor is connected with the bias voltage.

6. A The high-speed regenerative comparator circuit according to claim 2, wherein the second reset switch includes a seventh NMOS transistor, a source of the seventh NMOS transistor is connected with the first output terminal of the differential signal, a drain of the seventh NMOS transistor is connected with the second output terminal of the differential signal, and a gate of the seventh NMOS transistor is connected with the first clock signal.

7. A method for controlling a clock signal of a high-speed regenerative comparator circuit of claim 1, wherein,
when the first clock signal is at a high level, the comparator is in a reset state; at this time, the second clock signal is at a high level, the first reset switch turns off the bias voltage, the third clock signal is at a high level, and a path from an output terminal of the differential signal to the power supply voltage in the fast path is disconnected.

8. A The method according to claim 7, wherein,
when the first clock signal is at a low level, the comparator is in a latch state; at this time, the second reset switch is turned off, the current source is connected with the bias voltage, the signal input stage amplifies an input signal, a voltage of the output terminal rises until the second clock signal hops from low level to high level, and the first reset switch turns off the bias voltage; at this time, the third clock signal hops from high level to low level, the path from the output terminal of the differential signal to the power supply voltage in the fast path is disconnected, a terminal of the output terminals of differential signal that first reaches a threshold voltage turns on the positive feedback network of the latch and pulls the output voltage to the power supply voltage.

* * * * *